United States Patent [19]
Conn et al.

[11] Patent Number: 6,150,863
[45] Date of Patent: Nov. 21, 2000

[54] USER-CONTROLLED DELAY CIRCUIT FOR A PROGRAMMABLE LOGIC DEVICE

[75] Inventors: Robert O. Conn, Los Gatos; Peter H. Alfke, Los Altos Hills, both of Calif.

[73] Assignee: Xilinx, Inc., San Jose, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/053,879

[22] Filed: Apr. 1, 1998

[51] Int. Cl.$^7$ .................................................. H03H 11/26
[52] U.S. Cl. ...................... 327/270; 327/271; 327/276; 327/277
[58] Field of Search .................................. 327/270, 271, 327/273, 276, 277, 279, 295, 298, 299, 407, 415

[56] References Cited

U.S. PATENT DOCUMENTS

| | | | |
|---|---|---|---|
| 5,049,766 | 9/1991 | Van Driest et al. | 327/269 |
| 5,252,867 | 10/1993 | Sorrells et al. | 327/152 |
| 5,416,434 | 5/1995 | Kootstra et al. | 327/113 |
| 5,426,378 | 6/1995 | Ong | 326/39 |
| 5,481,563 | 1/1996 | Hamre | 375/226 |
| 5,570,294 | 10/1996 | McMinn et al. | 364/481 |
| 5,633,608 | 5/1997 | Danger | 327/270 |
| 5,663,767 | 9/1997 | Rumreich et al. | 348/537 |
| 5,727,021 | 3/1998 | Truebenbach | 375/226 |
| 5,790,611 | 8/1998 | Huang et al. | 375/371 |
| 5,796,673 | 8/1998 | Foss et al. | 365/233 |
| 5,818,890 | 10/1998 | Ford et al. | 375/371 |
| 5,841,296 | 11/1998 | Churcher et al. | 326/49 |

OTHER PUBLICATIONS

"The Programmable Logic Data Book", Sep. 1996, pp. 4–24 to 4–29 available from Xilinx, Inc., 2100 Logic Drive, San Jose, California 95124.

Xilinx Application Note XAPP056, entitled "System Design with New XC4000X I/O Features, v. 1.2", published Nov. 1997, available from Xilinx, Inc., 2100 Logic Drive, San Jose, California 95124.

*Primary Examiner*—Timothy P. Callahan
*Assistant Examiner*—An T. Luu
*Attorney, Agent, or Firm*—Arthur J. Behiel, Esq.; Lois D. Cartier

[57] ABSTRACT

An input block is provided that includes a user-controlled, variable-delay input circuit. The input circuit is adapted to receive an input signal and to output a delayed version of the input signal on an output node. A number of control signals dictate the amount of delay imposed on the input signal. The control signals, and therefore the amount of delay, are established using a control-signal generator. The generator can be used to actively alter the delay. In one embodiment, the control signal generator is implemented as a feedback circuit that automatically matches the delay period of the delay circuit with the delay period of a distributed clock signal.

15 Claims, 3 Drawing Sheets

USER-CONTROLLED DELAY CIRCUIT FOR A PROGRAMMABLE LOGIC DEVICE

CROSS-REFERENCE TO RELATED APPLICATION

This application relates to the following commonly assigned, concurrently filed U.S. patent application: Ser. No. 09/053,875 by Robert O. Conn entitled "VARIABLE-DELAY INTERCONNECT STRUCTURE FOR A PROGRAMMABLE LOGIC DEVICE", now issued as U.S. Pat. No. 6,008,666, which is incorporated herein by reference.

BACKGROUND OF THE INVENTION

1. Field of the Invention

The invention relates to integrated circuits (ICs). More particularly, the invention relates to programmable input and output blocks for ICs.

2. Description of the Background Art

Programmable logic devices (PLDs) are a well known type of digital IC that may be programmed by a user (e.g., a circuit designer) to perform specified logic functions. PLDs are becoming ever more popular, largely because they are less expensive and require less time to implement than semi-custom and custom integrated circuits.

One type of PLD, the field programmable gate array (FPGA), typically includes an array of configurable logic blocks (CLBS) that are programmably interconnected to each other and to programmable input/output blocks (IOBs). This collection of configurable elements may be customized by loading configuration data into internal configuration memory cells that define how the CLBs, interconnections, and IOBs are configured. The configuration data may be read from memory (e.g., an external PROM) or written into the FPGA from an external device. The collective states of the individual memory cells then determine the function of the FPGA.

IOBs provide the interface between external input/output (I/O) pads and the internal logic. Each IOB is typically associated with one I/O pad and can be configured for input, output, or bi-directional signals. FIG. 1 depicts a conventional IOB 100 similar to those of the XC4000EX™ family of devices available from Xilinx, Inc.

When configured as an input block, IOB 100 conveys digital input signals into the FPGA from I/O pad 115 through input buffer 116. These signals may be routed to the interior of the FPGA either directly, via line 118, or through register 120, as described in more detail below. IOB 100 also includes output circuitry 110 to convey signals from the FPGA to I/O pad 115 when IOB 100 is configured as an output block. A more complete discussion of output circuitry 110 and other circuits in IOB 100 can be found in pages 4–24 through 4–29 of "The Programmable Logic Data Book" (September, 1996) available from Xilinx, Inc., 2100 Logic Dr., San Jose, Calif., which pages are incorporated herein by reference. (Xilinx, Inc., owner of the copyright, has no objection to copying these and other pages referenced herein but otherwise reserves all copyright rights whatsoever.)

Data input through register 120 can be selectively delayed. The circuit of FIG. 1 has a two-tap delay circuit 130, offering choices of full delay (line 141), partial delay (line 142), or no delay (line 143). The amount of delay is user-specified by programming memory cells (not shown) to control the select inputs (also not shown) of a multiplexer 140. With the delay enabled, the setup and hold times of the input flip-flop are thereby modified so that normal clock routing does not result in a positive hold-time requirement, which could lead to unreliable system operation. An additional input path traverses a latch 135 gated by output clock OCLK that delays the input signal on line 118 until a signal is received from output clock OCLK. This programmable delay circuit is described in detail in Xilinx Application Note XAPP056, entitled "System Design with New XC4000X I/O Features, v. 1.2", published November 1997 and available from Xilinx, Inc., which is incorporated herein by reference.

IOBs are often used as input ports for serial data communications. Various modulation schemes have been devised to encode data into a serial format, allowing that data to be conveyed over a single electrical or optical conductor. Such schemes are conventionally self-clocking, which is to say that the clock used to interpret the input signal is derived from the input signal itself. Unfortunately, many random and systematic perturbations typically corrupt the signal. These perturbations can cause the timing relationship between the derived clock and the data signal to vary, causing noise conditions commonly referred to as "drift" and "jitter." These conditions differ in that drift occurs over a time period that is long relative to the period of the derived clock, whereas jitter occurs over a time period that is short relative to the period of the derived clock. For a more detailed discussion of jitter, including conventional methods for measuring jitter, see U.S. Pat. No. 5,481,563, entitled "Jitter Measurement Using a Statistically Locked Loop," which is incorporated herein by reference.

SUMMARY OF THE INVENTION

In accordance with the present invention, a delay circuit allows for external control of delay circuit 130, thereby advantageously permitting a user to test the sensitivity of IOB 100 to jitter. While the prior art IOB controlled input delay using steady-state memory cells, the present invention can use varying signals for controlling delay. In this manner, the present invention provides a system with enhanced testability and functionality compared to conventional delay circuits.

One embodiment of the invention includes a delay circuit with a variable-delay input block adapted to receive an input signal and to provide a delayed version of the input signal on an output node. A user can select various delay periods by changing control signals to a number of control terminals.

In one embodiment, the control signals, and therefore the amount of delay, are established using a control-signal generator. The generator actively alters the delay, thereby advantageously allowing a user to test for noise immunity or metastability. For example, the control-signal generator can generate a random control signal, whereby the resulting delayed signal resembles a jittering serial data signal. This signal is used to test various types of circuits for jitter sensitivity. The control-signal generator can also be configured to step through progressively longer delay periods while monitoring a selected output signal for a metastable condition. In another embodiment, the control signal generator is implemented as a feedback circuit that automatically matches the delay period of the delay circuit with the delay period of a distributed clock signal.

DETAILED DESCRIPTION OF THE DRAWINGS

Figure 2:
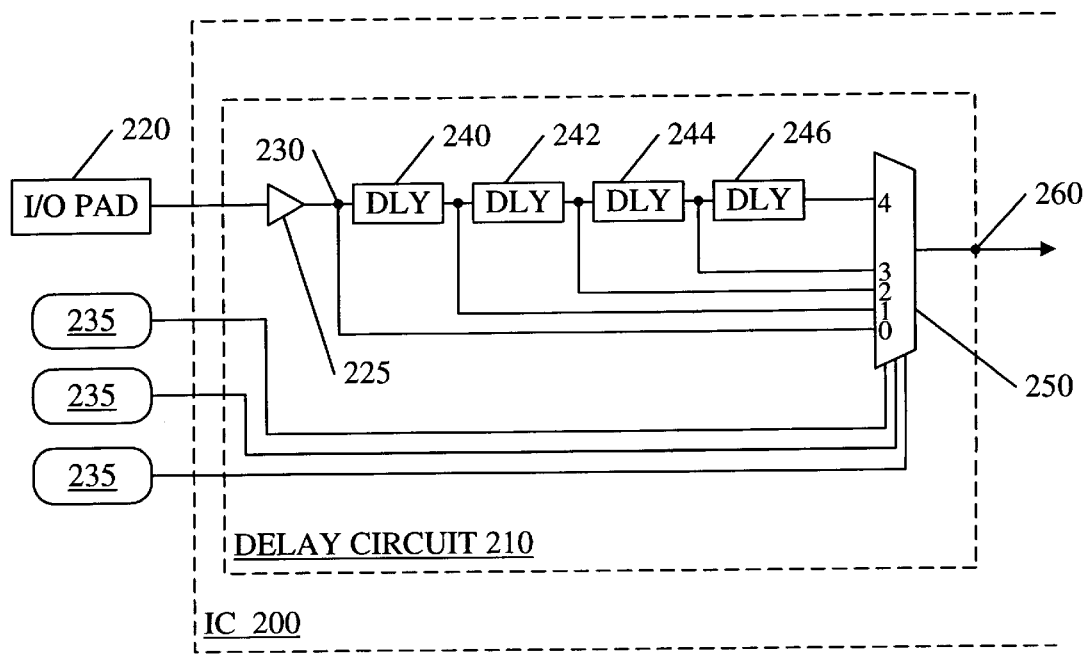
FIG. 2 depicts an IC 200 that includes a user-controlled, variable-delay circuit 210 in accordance with the present invention.

FIG. 2 depicts an IC 200 that includes a user-controlled variable-delay circuit 210 in accordance with the present invention. Delay circuit 210 receives input signals on an I/O pad 220 and conveys these signals through buffer 225 to a buffered input node 230. User-controlled input terminals 235 accept delay instructions that selectively route the signal on buffered input node 230 through from zero to four delay elements 240, 242, 244, and 246 to input nodes of a multiplexer 250. Multiplexer 250 conventionally selects one of five input signals based upon the delay instructions on input terminals 235, and provides the selected signal on an output node 260. The signal levels on input terminals 235 thus determine the delay period applied to the input signals on I/O pad 220.

Figure 1:
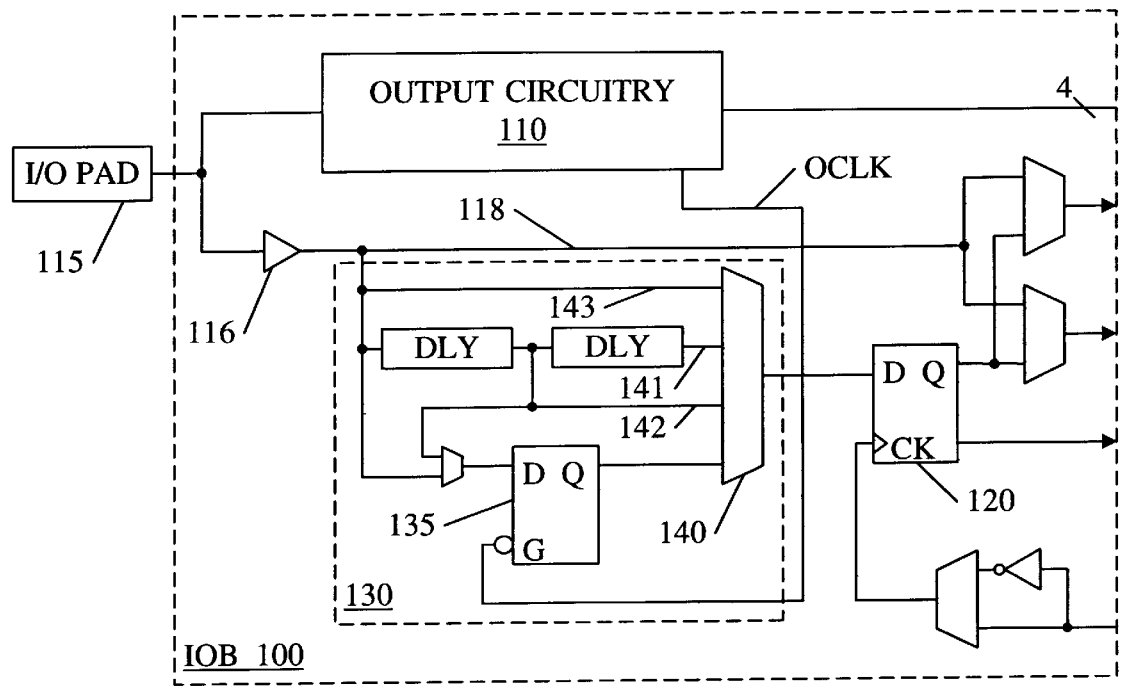
FIG. 1 depicts a conventional IOB 100 similar to those of the XC4000EX family of devices available from Xilinx, Inc.

For ease of illustration, only four delay elements are depicted in FIG. 2. A greater number of delay elements increases the cost of implementing delay circuit 210, but offers increased total delay and/or finer delay granularity. For example, one embodiment includes seven delay elements connected to output node 260 via a multiplexer with three select terminals. This configuration allows a user to select from among eight possible delay periods (including no delay). Other embodiments include one or more memory elements similar to latch 135 in IOB 100 of FIG. 1.

Figure 3:
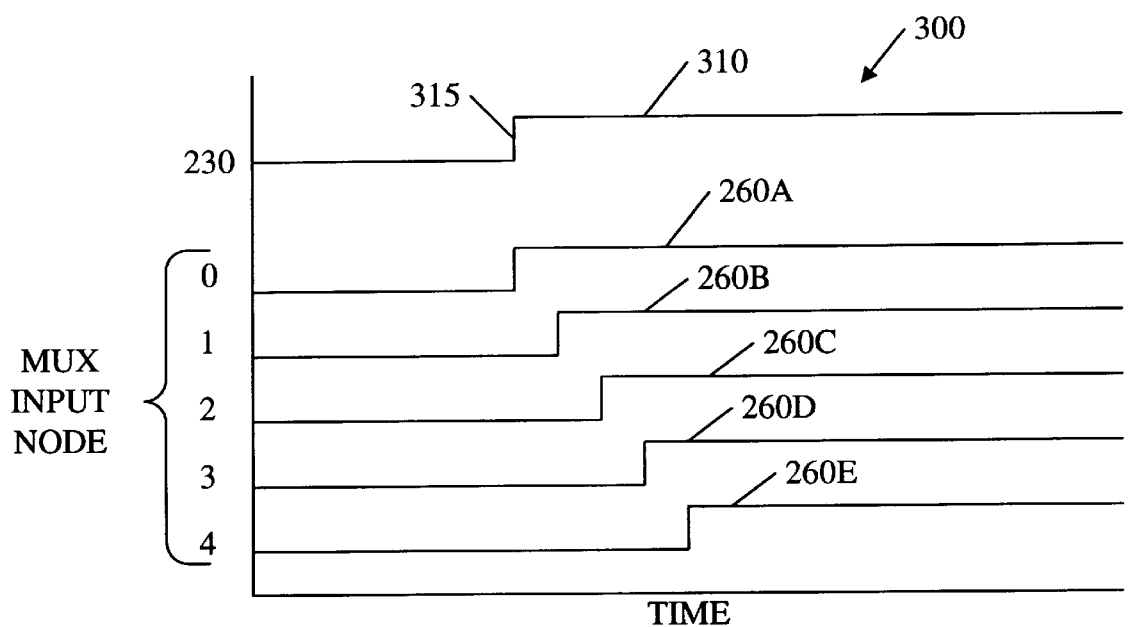
FIG. 3 is a simple signal diagram 300 depicting the effects of selecting a given amount of delay.

FIG. 3 is a simple signal diagram 300 depicting the effects of selecting a given amount of delay. The first waveform 310, an exemplary input signal on input node 230, includes an illustrative signal transition 315. If no delay is selected, control signals 235 select input "0" of multiplexer 250 so that the waveform 260A on output node 260 is substantially the same as waveform 310, the delay being limited to the delay through multiplexer 250. Selecting the remaining multiplexer input terminals (1 through 4) allows for successive amounts of additional delay.

In one embodiment, each delay element is a single CMOS inverter that imposes approximately two nanoseconds of delay. (This embodiment of the invention is preferably used in programmable devices, so the input can be re-inverted with no additional delay at the destination CLB.) Each additional delay element thus imposes two additional nanoseconds of delay, for a granularity of two nanoseconds and a total possible delay of eight nanoseconds, resulting in 2, 4, 6, and 8 nanosecond delays for waveforms 260B, 260C, 260D, and 260E, respectively. Delay elements 240, 242, 244, and 246 can be replaced by other types of delay-inducing circuits, or can be modified to provide more or less delay to satisfy the requirements for a particular application. For example, binary weight delay elements can be used to achieve fine granularity using relatively few delay elements. Finer granularity can be achieved by combining the effects of variable-delay element 210 with the user-controlled interconnect lines described in the above-incorporated application entitled "Variable-Delay Interconnect Structure For a Programmable Logic Device." As discussed in that reference, the signal-propagation delays associated with those interconnect lines are modified with user logic by altering capacitive and resistive loads. These and other modifications are well within the skill of those in the art in the light of the disclosure herein and in the referenced application.

Providing the user with the option of stepping through a number of delay values gives the user the ability to test for metastability in a given circuit. For example, the user can progressively introduce increasing amounts of delay while monitoring an output for a metastable condition. Such testing can be used to assess a circuit's sensitivity to timing errors.

Figure 4:
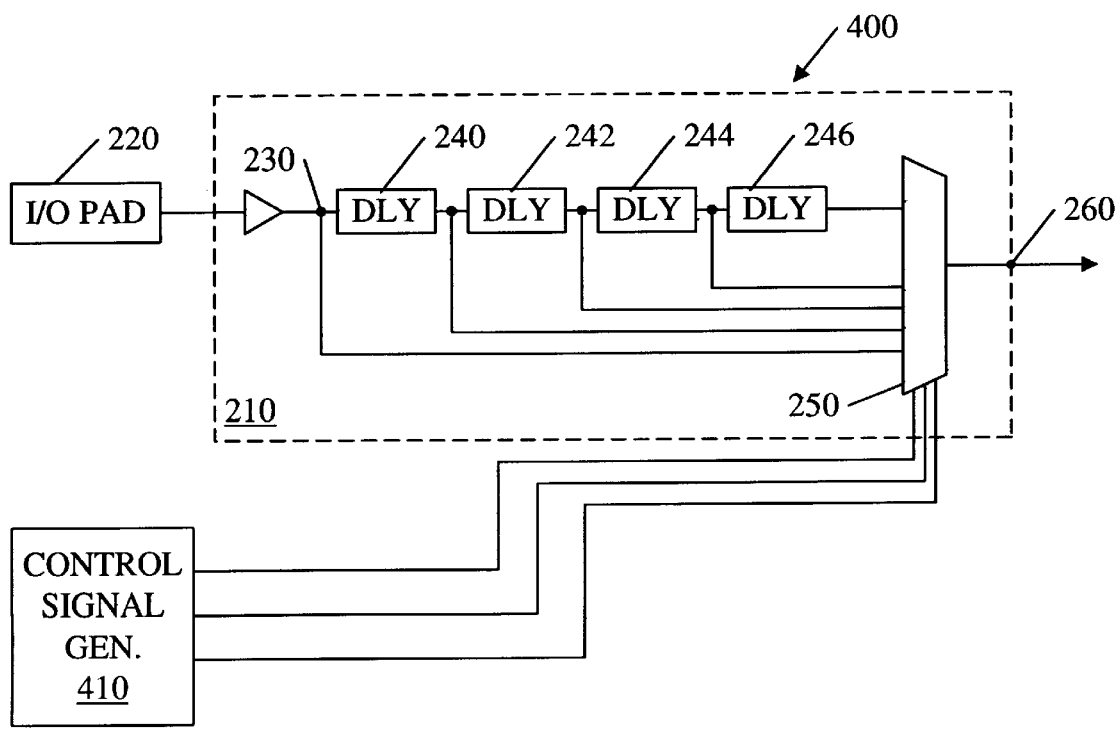
FIG. 4 is a schematic diagram of a variable delay system 400 in accordance with another embodiment of the invention.

FIG. 4 is a schematic diagram of a variable delay system 400 in accordance with another embodiment of the invention. System 400 includes delay circuit 210, which is similar to the like-numbered circuit of FIG. 2. A control-signal generator 410 could be easily designed by those of ordinary skill in the art to provide the requisite signals for establishing the level of delay provided by delay circuit 210. Control-signal generator 410 may integrated with delay circuit 210 or may be connected to delay circuit 210 via external control pads.

Control-signal generator 410 selectively controls the delay through delay circuit 210. For example, control-signal generator 410 and delay circuit 210 combined can be used to create a jitter generator by including a random-number generator in control-signal generator 410. Such an embodiment would provide random numbers to multiplexer 250. These random numbers would, in turn, select random amounts of delay between input node 230 and output node 260. The resulting output signal on output node 260 would resemble a jittering input signal. Eliminating one or more extreme delays from the randomly sampled possibilities narrows the "width" of the jitter. A random number generator for use in the embodiment of FIG. 4 might be implemented as a random noise generator connected to the control inputs of multiplexer 250 via a conventional analog-to-digital converter. In another embodiment, the random number generator is implemented as a pseudo-random linear feedback shift register.

Figure 5:
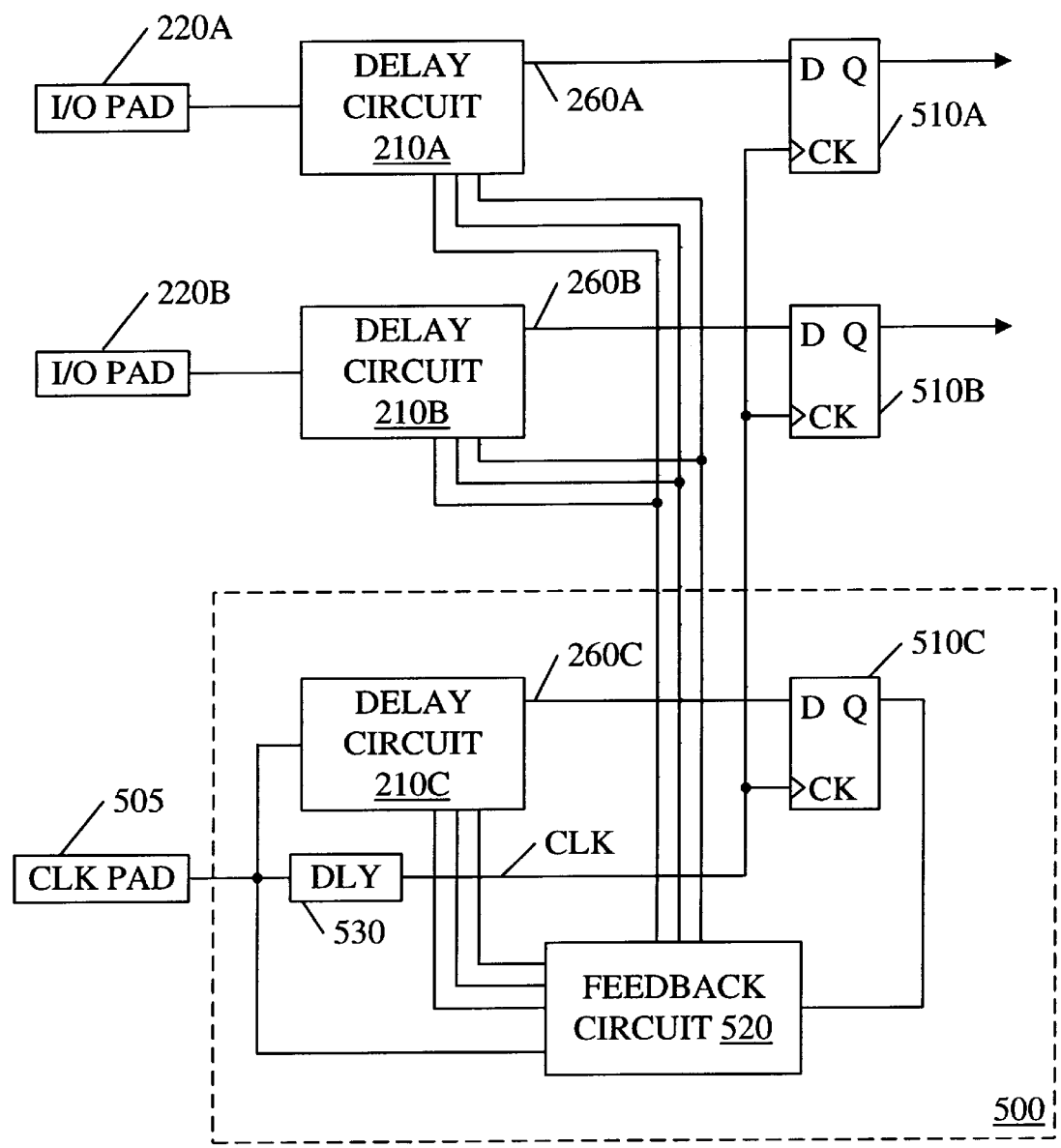
FIG. 5 is a schematic diagram of an automated delay-optimization circuit configured to establish the appropriate delay periods for a pair of delay circuits.

FIG. 5 is a schematic diagram of a delay-optimization circuit 500 configured, in accordance with an embodiment of the present invention, to automatically establish the appropriate delay periods for a pair of delay circuits 210A and 210B. Each of delay circuits 210A–210C is connected to respective I/O pads 220A, 220B, 505 and output nodes 260A–260C. Features in FIG. 5 are identical to the like-numbered features of FIGS. 2 and 4. Output nodes 260A–260C are also connected to respective phase comparators, which are implemented as conventional rising-edge "D" flip-flops 510A–510C in the depicted embodiment. In this embodiment, I/O pad 505 provides the clock for delay circuit 210C, feedback circuit 520, and (after traversing delay 530) flip-flops 510A–510C.

Delay-optimization circuit 500 has a feedback loop that includes flip-flop 510C and a feedback circuit 520. As described in detail below, this feedback loop compares the delay imposed by delay circuit 210C with the delay associated with a distributed clock signal on line CLK. The feedback loop then adjusts the delay period of delay circuit 210C to closely match the clock delay. The adjusted delay period of delay circuit 210C provides a reference delay period for the remaining delay circuits 210A and 210B.

Phase comparator flip-flop 510C compares the output signal from delay circuit 210C with the distributed clock signal on clock line CLK. The output terminal Q of flip-flop 510C connects to feedback circuit 520 through feedback line 515. Feedback circuit 520 in turn controls the delay period imposed by each of delay circuits 210A–210C in the manner described above in connection with FIG. 4.

In one embodiment, feedback circuit 520 is a three-bit up/down counter having a three-line output bus 525 connected to each of three input terminals of delay circuits 210A and 210B, and a second three-line output bus 527 connected to each of three input terminals of delay circuit 210C. Feedback circuit 520 can also, for example, be a shift register, or an analog equivalent to an up/down counter. In one embodiment, feedback circuit 520 is adapted to include additional input terminals to allow a user to adjust the delay periods of the associated delay circuits. The following discussion assumes that feedback circuit 520 is a conventional up/down counter, which may be implemented using programmable logic.

Feedback circuit 520 controls the respective delays associated with each of delay circuits 210A–210C by monitoring the output of flip-flop 510C. If the delay imposed by delay circuit 210C is less than that of the distributed clock on line CLK, then flip-flop 510C provides a logic zero to feedback circuit 520, causing feedback circuit 520 (a counter) to increment. (In an embodiment using falling-edge flip-flops to implement the phase comparators, the logic values described for this embodiment are reversed.) Incrementing feedback circuit 520 in turn increases the delay imposed by delay circuit 210C. If, on the other hand, the delay imposed by delay circuit 210C is greater than that of the distributed clock, then flip-flop 510C provides a logic one to feedback circuit 520, causing feedback circuit 520 to decrement, thereby decreasing the delay imposed by delay circuit 210C. The combination of flip-flop 510C and feedback circuit 520 thus establishes and maintains an optimized (or nearly optimized) setting for delay circuit 210C.

Each of delay circuits 210A-210C operates at substantially the same temperature, is powered by substantially the same supply voltage, and is typically formed using the same process steps. As a consequence of these similarities, each of delay circuits 210A–210C exhibits approximately the same delay period. For this reason the output of feedback circuit 520, once optimized for delay circuit 210C, also provides an approximately appropriate setting for the other delay circuits 210A and 210B.

However, the settings for delay circuits 210A and 210B are not necessarily identical to the setting for delay circuit 210C. In one embodiment, the delay periods for delay circuits 210A and 210B are designed to be slightly longer than the setting for delay circuit 210C, to compensate for clock skew due to the distance between the circuits. This offset ensures that delay circuits 210A and 210B have sufficient setup times for the signals on I/O pads 220A and 220B. In one embodiment, for example, the delay periods associated with delay circuits 210A and 210B are increased by the minimum granularity of delay circuits 210A and 210B. Thus, the input delays imposed on the signals on I/O pads 220A and 220B are automatically adjusted to minimize the setup time.

While delay-optimization circuit 500 is shown controlling a pair of delay circuits 210A and 210B, delay-optimization circuit 500 can be similarly configured to control from one to many delay circuits. For example, additional delay-optimization circuits might be distributed over a given IC to compensate for localized differences in the delay periods of a distributed clock. Delay circuits 210A–210C may also be configured with additional input terminals that allow a user to independently adjust the associated delay periods.

The delay circuit of the invention can also be applied to signal paths other than I/O input paths. Other circuit applications may benefit from the intentional introduction of delay. Synchronous switching of signals can create large noise spikes, when many clocked signals switch at precisely the same time. This problem can be ameliorated by introducing delay to stagger the clocked signals so that they do not switch at precisely the same instant.

This use of delay to avoid noise spikes can be used advantageously for output signals. Simultaneous switching of output signals can cause large noise spikes and ground bounce. If such spikes are periodic and of sufficient magnitude they can interfere with device performance, and possibly violate Federal Communication Commission Rules. Such problems can be avoided by introducing small amounts of delay into the various output signals so that switching is rarely, if ever, simultaneous.

While the present invention has been described in connection with specific embodiments, variations of these embodiments will be obvious to those of ordinary skill in the art. For example, in some embodiments the amount of delay may be selected by programming memory cells. As another example, the above text describes the input delay circuit of the invention in the context of PLDs. However, the invention can also be applied to non-programmable ICs. Moreover, some components are shown directly connected to one another while others are shown connected via intermediate components. In each instance the method of interconnection establishes some desired electrical communication between two or more circuit nodes. Such communication may often be accomplished using a number of circuit configurations, as will be understood by those of skill in the art. Therefore, the spirit and scope of the appended claims should not be limited to the foregoing description.

What is claimed is:

1. An input block for an integrated circuit (IC), the input block comprising:
   a) an input terminal adapted to receive an input signal from a first source, the input signal including a first signal transition;
   b) a control terminal adapted to receive a delay instruction from a variable signal source, the delay instruction providing indicia of a delay period to apply to the first input signal, the variable signal source progressively changing the delay instruction such that the delay period progressively changes;
   c) a variable delay circuit having:
      an input node connected to the input terminal;
      an output node;
      at least one delay element for providing a delayed version of the input signal on the output node; and
      a control node adapted to receive the delay instruction from the control terminal,
   wherein the delayed version of the input signal includes a second signal transition delayed from the first signal transition by the delay period specified by the delay instruction; and
   d) a monitor element whereby the delayed version of the input signal on the output node is monitored for a metastable condition.

2. The input block of claim 1, wherein the IC is a programmable logic device.

3. The input block of claim 1, wherein the variable delay circuit includes a plurality of delay elements and a multiplexer adapted to selectively connect the input node to the output node through different numbers of the delay elements.

4. The input block of claim 3, wherein the control node is connected to a select terminal of the multiplexer.

5. The input block of claim 1, further comprising a phase comparator having a first input terminal connected to the output node of the variable delay circuit, a second input terminal providing a reference clock signal, and an output terminal.

6. An input block for an integrated circuit (IC), the input block comprising:
   a) an input terminal adapted to receive an input signal from a first source, the input signal including a first signal transition;
   b) a control terminal adapted to receive a delay instruction from a variable signal source, the delay instruction providing indicia of a delay period to apply to the first input signal; and
   c) a variable delay circuit having:
      an input node connected to the input terminal;
      an output node;
      at least one delay element for providing a delayed version of the input signal on the output node, wherein the delayed version of the input signal includes a second signal transition delayed from the first signal transition by the delay period specified by the delay instruction; and
      a control node adapted to receive the delay instruction from the control terminal,
   wherein the variable signal source comprises a feedback circuit having at least one input terminal connected to the output node of the variable delay circuit and at least one output terminal providing control information to the control node of the variable delay circuit.

7. The input block of claim 6, wherein the feedback circuit enables automatic adjustment of a setup time for the input block.

8. An input block for an integrated circuit (IC), the input block comprising:
   a) an input terminal adapted to receive an input signal from a first source, the input signal including a first signal transition;
   b) a control terminal adapted to receive a delay instruction from a variable signal source, the delay instruction providing indicia of a delay period to apply to the first input signal;
   c) a variable delay circuit having:
      an input node connected to the input terminal;
      an output node;
      at least one delay element for providing a delayed version of the input signal on the output node, wherein the delayed version of the input signal includes a second signal transition delayed from the first signal transition by the delay period specified by the delay instruction; and
      a control node adapted to receive the delay instruction from the control terminal; and
   d) a phase comparator having a first input terminal connected to the output node of the variable delay circuit, a second input terminal providing a reference clock signal, and an output terminal,
   wherein the variable signal source comprises a feedback circuit having an input terminal connected to the output terminal of the phase comparator and at least one output terminal providing control information to the control node of the variable delay circuit.

9. The input block of claim 8, wherein the feedback circuit enables automatic adjustment of the setup time for the input block.

10. An integrated circuit, comprising:
   a first variable-delay circuit adapted to receive an input signal on an input terminal and to output a delayed version of the input signal on a first output terminal, the first variable delay circuit including at least one control terminal adapted to receive controls signals indicative of a delay duration to apply to the input signal;
   a control-signal generator having at least one output terminal connected to the at least one control terminal of the first variable-delay circuit, the control-signal generator being adapted to provide the control signals indicative of the delay duration, the control-signal generator progressively changing the control signals such that the delay duration progressively changes; and
   means for monitoring the delayed version of the input signal for a metastable condition.

11. The integrated circuit of claim 10, wherein the integrated circuit is a programmable logic device.

12. The integrated circuit of claim 11, wherein the first variable-delay circuit is a portion of an input block of the programmable logic device.

13. The integrated circuit of claim 10, wherein the control-signal generator comprises a control input terminal, and the integrated circuit further comprises a phase comparator having an input terminal connected to the first output terminal of the first variable delay circuit and an output terminal connected to the control input terminal of the control-signal generator.

14. The integrated circuit of claim 10, wherein the control-signal generator is an up/down counter.

15. The integrated circuit of claim 10, further comprising a second variable-delay circuit having at least one control terminal connected to the at least one output terminal of the control-signal generator.

* * * * *